(12) United States Patent
Lee et al.

(10) Patent No.: US 7,983,066 B2
(45) Date of Patent: Jul. 19, 2011

(54) PASSIVE MATRIX-ADDRESSABLE MEMORY APPARATUS

(75) Inventors: Hee-Chul Lee, Daejeon (KR); Woo-Young Kim, Daegu (KR); Chi-Ho Hwang, Daejeon (KR); Yong-Soo Lee, Daejeon (KR); Sang-Youl Kim, Daejeon (KR); Du-Youn Ka, Seoul (KR)

(73) Assignee: Korea Advanced Institute of Science and Technology (KR)

( * ) Notice: Subject to any disclaimer, the term of this patent is extended or adjusted under 35 U.S.C. 154(b) by 199 days.

(21) Appl. No.: 12/495,133

(22) Filed: Jun. 30, 2009

(65) Prior Publication Data

US 2010/0002489 A1    Jan. 7, 2010

(30) Foreign Application Priority Data

Jul. 1, 2008    (KR) .................. 10-2008-0063307

(51) Int. Cl.
  *G11C 11/22*    (2006.01)
(52) U.S. Cl. ...................... 365/145; 365/146
(58) Field of Classification Search .......... 365/145, 365/146; 257/295, 296
See application file for complete search history.

(56) References Cited

U.S. PATENT DOCUMENTS 5,578,845 A * 11/1996 Masuda et al. ............. 257/295
7,291,878 B2 * 11/2007 Stipe ........................ 257/296

* cited by examiner

*Primary Examiner* — Son T Dinh
(74) *Attorney, Agent, or Firm* — The Belles Group, P.C.

(57) ABSTRACT

Disclosed is a passive matrix-addressable memory apparatus. The passive matrix-addressable memory apparatus comprises: a plurality of first electrode lines horizontally arranged with respect to each other; a plurality of second electrode lines disposed orthogonal to the plurality of first electrode lines to be horizontally arranged with respect to each other; a memory unit formed between the plurality of first electrode lines and the plurality of second electrode lines, and containing an electrically polarizable material exhibiting hysteresis; and a switch unit. The switch unit comprises: first electrodes of a cantilever structure respectively formed between the memory unit and the plurality of first electrode lines to be electrically connected to the plurality of first electrode lines; and second electrodes electrically connected to the memory unit to be spaced apart from the first electrodes to face the first electrodes.

12 Claims, 12 Drawing Sheets

PRIOR ART

After $V_R > V_{PI}$ $V_R < -V_{PI}$

PASSIVE MATRIX-ADDRESSABLE MEMORY APPARATUS

CROSS-REFERENCE TO RELATED APPLICATION

This application claims priority from Korean Patent Application No. 10-2008-0063307, filed Jul. 1, 2008, which is hereby incorporated by reference.

BACKGROUND OF THE INVENTION

1. Field of the Invention

The present invention relates to a passive matrix-addressable memory apparatus.

2. Description of the Related Art

Since ions or molecules are arranged in a specific direction in ferroelectric or electret materials used as memory materials in even a state that an external voltage is not applied, they have polarization. Such ferroelectric or electret materials maintain two stable states by polarization. Two stable states are regarded as logic states '0' and '1'. Accordingly, the ferroelectric or electret materials have been applied to a nonvolatile memory device using polarization.

A capacitor may be formed of an electrode/ferroelectric or electret/electrode structure using ferroelectric or electret materials as dielectric materials. Upon applying an operation voltage Vs greater than a coercive voltage 'Vc' to both electrodes of the capacitor, referring to FIG. 1, the both electrodes of the capacitor enters a saturated polarization Ps state according to a hysteresis loop. Meanwhile, when a voltage is not applied to the capacitor, the capacitor remains in a remanent polarization Pr state, which may be regarded as one of logic states '1' and '0'. Likewise, upon applying an operation voltage −Vs having a polarity opposite to Vs to both electrodes of the capacitor, the both electrodes thereof enter a saturated polarization state of −Ps. In the meantime, when a voltage is not applied to the both electrodes of the capacitor, it remains in a remanent polarization state, thereby changing a previous logic state.

FIG. 2 is a view illustrating a conventional passive matrix memory device 200 using ferroelectric or electret materials.

Referring to FIG. 2, the conventional passive matrix memory device 200 includes a memory layer 210 made of ferroelectric or electret materials, a plurality of bit lines 220 arranged parallel to each other at an upper portion of the memory layer 210, and a plurality of word lines 230 arranged orthogonal to the bit lines 220 parallel to each other at an under portion of the memory layer 210.

The bit lines 220 and word lines 230 are arranged orthogonal to each other. Further, ferroelectric and electret materials are formed between the bit lines 220 and the word lines 230. Referring to FIG. 3, accordingly, one memory cell having a bit line 220/ferroelectric material or electret material 210/word line 230 structure is provided at an intersection point (j, k) of the bit line 220 and the word line 230. It is easy to manufacture the conventional passive matrix memory device 200. Since the conventional passive matrix memory device 200 has a smaller number of transistors in comparison with an active matrix memory device, it may perform high-density storage.

The conventional passive matrix memory device 200 is driven in such a way that data are stored, and erased or read in and from a memory cell disposed at an intersection of the specific word line and the specific bit line by applying a voltage pulse to a specific word line and a specific bit line so as to select a desired memory cell. However, such a driving method may cause electric interference in memory cells that are not selected. The electric interference may destroy data stored in the memory cells, which are not selected.

In order to solve the problems, there has been proposed a method reducing electric interference based on ⅓ voltage selection rule in a driving method of the conventional memory device. FIG. 4 is a view illustrating a ⅓ voltage selection rule. The ⅓ voltage selection rule causes only ⅓ of an operation voltage Vs to be applied to bit lines and word lines of memory cells that are not selected, thereby influencing the memory cells a little by electric interference. In this case, Vs/3 being ⅓ voltage means a voltage less than a coercive voltage of a ferroelectric or electrets material.

However, there are problems in the ⅓ voltage selection rule. For example, in a state that data having logic state '1' are stored in a memory cell, when ⅓ operation voltage Vs/3 according to the ⅓ voltage selection rule having a polarity capable of writing logic state '0' is continuously applied to a specific memory cell, a logic state of a specific memory cell can be changed to a state opposite to a previous state. Namely, the specific memory cell can be changed from a previous logic state '1' to a logic state '0'. Meanwhile, in a state that data having a logic state '0' are stored in the specific memory cell, if ⅓ operation voltage Vs/3 having a polarity capable of writing a logic state '1' is continuously applied thereto, the logic state of a specific memory cell can be also changed to a state opposite to a previous state. Korean patent laid-open publication No. 10-2007-0094646 defines such a phenomenon as disturbing. In the meantime, the document "Japanese Journal of Applied Physics, Vol. 36(1997), pp. 1655 (H. Ishiwara)" experimentally approved the disturbing using SBT being a ferroelectric inorganic material. The experiment shows that upon continuously applying a voltage pulse of Vs having a polarity capable of inverting a logic state to a specific memory cell, a logic state of stored data is inverted. Moreover, the document explained that the less an interference voltage is, the longer data is maintained.

Hereinafter, disturbing or electric interference according to a ⅓ voltage selection rule will be described in detail.

Referring to FIG. 2, the conventional memory device 200 includes a memory unit 210, N bit lines 220, and M word lines 230. A specific memory cell of the conventional memory device 200 is expressed by '(j, k) cell' for convenience sake.

In order to write data in entire memory cells of the conventional memory device 200, M×N bit data should be stored. For example, data are written in a (1, 1) cell by applying a voltage to a first word line and a first bit line. In this case, a voltage having amplitude of ⅓ of a voltage capable of writing data is applied to all remaining memory cells except for a (1, 2) cell. There does not cause a problem in a memory cell that is not written yet. A firstly written (1, 1) cell has electric interference with ⅓ voltage from a second write. Accordingly, a (1, 1) cell has electric interference (M×N)−1 times until data are written in an (N, M) cell being a final cell. The passive matrix-addressable memory device is advantageous in that it can perform high-density storage. Accordingly, N and M is significantly greater than 1, each time a write operation is performed, a (1, 1) cell inevitably has electric interference as much as a storage capacity of a memory device.

Interference occurs in a data reading operation as well as a data writing operation in the passive matrix memory device 200. Because each memory cell does not have an active device, it is impossible to non-destructively read data stored in a memory cell. Consequently, after destructive-reading data, a write operation should be again performed. In memory cells in which a rewrite operation is performed after reading data, even a little polarization loss occurs in a previous step, a previously written logic state may be maintained through a rewrite procedure. However, non-read memory cells are inevitably exposed to an interference voltage as many as the number of read memory cells.

So as to solve electric interference occurring due to a ⅓ voltage selection rule, there was suggested a method for dividing a passive matrix based memory of large storage capacity into a plurality of small segments in Patent No. 20035225 by Thin Film Electronics ASA. Upon dividing a memory cell into a plurality of segments, because a specific segment is electrically and physically isolated from other segments during a write operation to the specific segment, electric interference does not occur. The more the number of the segments are, the less the applied number of an interference voltage can be. However, because the same number of active devices is additionally required by the corresponding number of word lines and bit lines every segment, high-density storage capacity being the greatest merit of the passive matrix addressable arrangement is removed.

Meanwhile, so as to solve electric interference occurring due to a ⅓ voltage selection rule, there was suggested a refresh function in Korean patent laid-open publication No. 10-2007-0094646. In the patent, an interference voltage is applied the same number of times as the number of memory cells writing data. Accordingly, if a counter counts the any number of events to write the events, all data written in a specific segment are rewritten. The patent may reduce data loss due to electric interference but cannot fundamentally stop it. As a result, a fundamental method reducing electric interference is to reduce an amplitude of a voltage applied to both ends of a memory cell storing data.

SUMMARY OF THE INVENTION

The present invention has been made in view of the above problems, and it is an object of the present invention to provide a passive matrix-addressable memory apparatus that may minimize electric interference by applying a voltage less than an interference voltage to ferroelectric or electret materials.

In accordance with an exemplary embodiment of the present invention, there is provided a passive matrix-addressable memory apparatus comprising: a plurality of first electrode lines horizontally arranged with respect to each other; a plurality of second electrode lines disposed orthogonal to the plurality of first electrode lines to be horizontally arranged with respect to each other; a memory unit formed between the plurality of first electrode lines and the plurality of second electrode lines, and containing an electrically polarizable material exhibiting hysteresis; and a switch unit, wherein the switch unit comprises: first electrodes of a cantilever structure respectively formed between the memory unit and the plurality of first electrode lines to be electrically connected to the plurality of first electrode lines; and second electrodes electrically connected to the memory unit to be spaced apart from the first electrodes to face the first electrodes, the first electrodes and the second electrodes are electrically connected to each other when a voltage applied between the first electrodes and the second electrodes is equal to or greater than a predetermined voltage.

The switch unit further comprises a support portion formed between the first electrodes and the memory unit for supporting the first electrodes on the memory unit so that the first electrodes are spaced apart from the memory unit.

The memory unit contains one of a ferroelectric material and an electret material.

The first electrodes are formed to contain at least one of metals, conductive polymers, carbon nano tubes, and fullerenes.

The first electrodes are linearly formed or bent at least once in a horizontal direction of the second electrodes.

The first electrodes are moved to the second electrodes to be electrically connected to the second electrodes by electrostatic attraction when a voltage applied between the first electrodes and the second electrodes is equal to or greater than a predetermined voltage.

In accordance with another embodiment of the present invention, there is provided a passive matrix-addressable memory apparatus comprising: a plurality of first electrode lines horizontally arranged with respect to each other; a plurality of second electrode lines disposed orthogonal to the plurality of first electrode lines to be horizontally arranged with respect to each other; a memory unit formed between the plurality of first electrode lines and the plurality of second electrode lines, and containing an electrically polarizable material exhibiting hysteresis; and a switch unit, wherein the switch unit comprises: first electrodes of a cantilever structure respectively formed between the memory unit and the plurality of first electrode lines, one sides of the first electrodes being electrically connected to the first lines, another sides of the first electrodes being spaced apart from the plurality of first electrode lines to face the first electrode lines; and second electrodes electrically connected to the memory unit to be spaced apart from the another sides of the first electrodes to face the first electrodes, wherein the first electrodes and the second electrodes are electrically connected to each other when a voltage applied between the first electrodes and the second electrodes is equal to or greater than a predetermined voltage.

The switch unit further comprises a support portion formed between the first electrodes and the memory unit for supporting the first electrodes on the memory unit so that the first electrodes are spaced apart from the memory unit.

The memory unit contains one of a ferroelectric material and an electret material.

The first electrodes are formed to contain at least one of metals, conductive polymers, carbon nano tubes, and fullerenes.

The first electrodes are linearly formed or bent at least once in a horizontal direction of the second electrodes.

The first electrodes are moved to the second electrodes to be electrically connected to the second electrodes by electrostatic repulsion between the first electrodes and the first electrode line and electrostatic attraction between the first electrodes and the second electrodes when a voltage applied between the first electrodes and the second electrodes is equal to or greater than a predetermined voltage.

In the present invention, by reducing an amplitude of an interference voltage applied to a memory unit, although the exposed number of an interference voltage is increased, a state of data stored in respective memory cells may be stably maintained.

BRIEF DESCRIPTION OF THE DRAWINGS

The objects, features and advantages of the present invention will be more apparent from the following detailed description in conjunction with the accompanying drawings, in which:

FIG. 5b is a view illustrating an equivalent circuit of FIG. 5a;

DETAILED DESCRIPTION OF EXEMPLARY EMBODIMENTS

A principle of the present invention will be simply described prior to explanation of an embodiment of the present invention.

Figure 1:
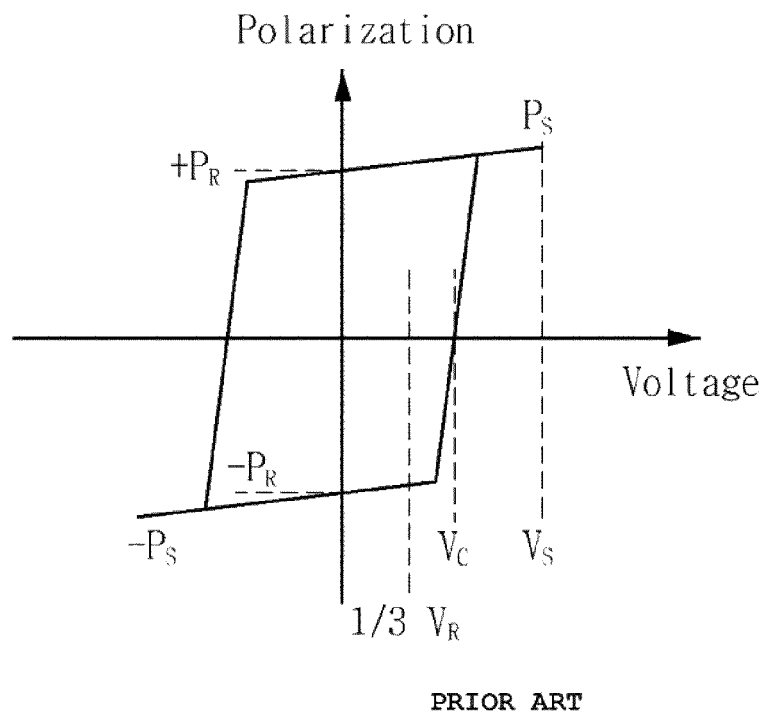
FIG. 1 is a view illustrating a polarization hysteresis loop according to voltage variation across a capacitor using a dielectric material as a ferroelectric or electrets material.
Figure 2:
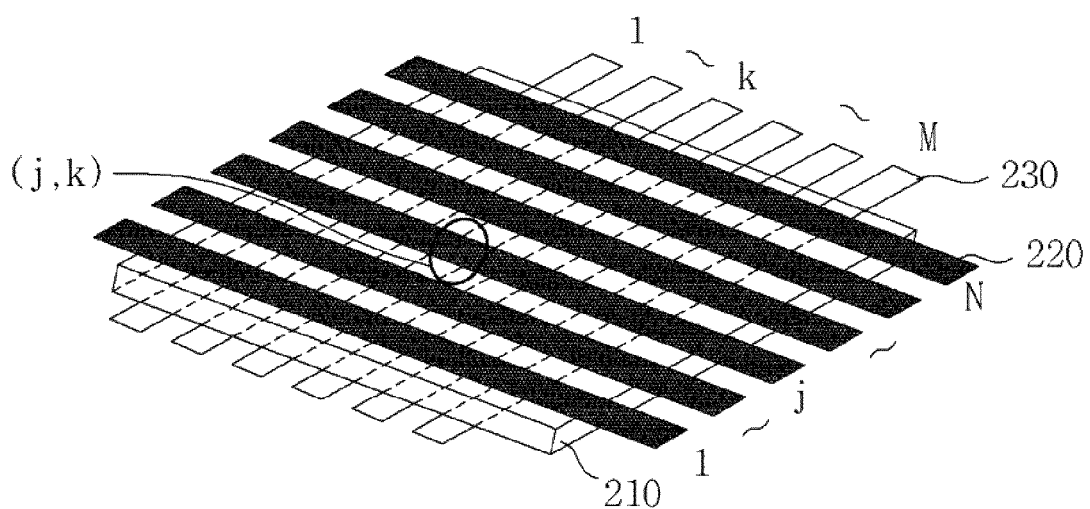
FIG. 2 is a view illustrating a conventional passive matrix memory apparatus.
Figure 3:
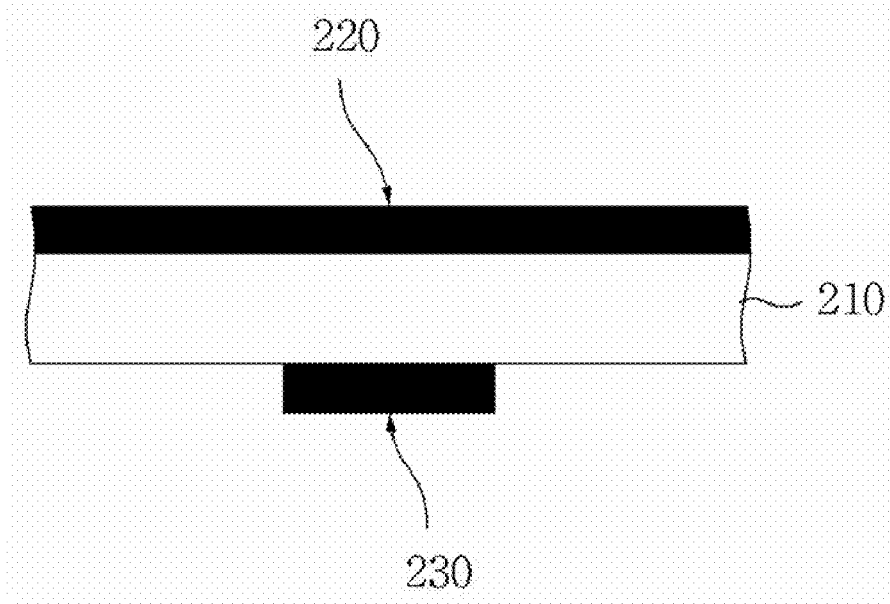
FIG. 3 is a view a section of a (j, k) cell shown in FIG. 2.
Figure 4:
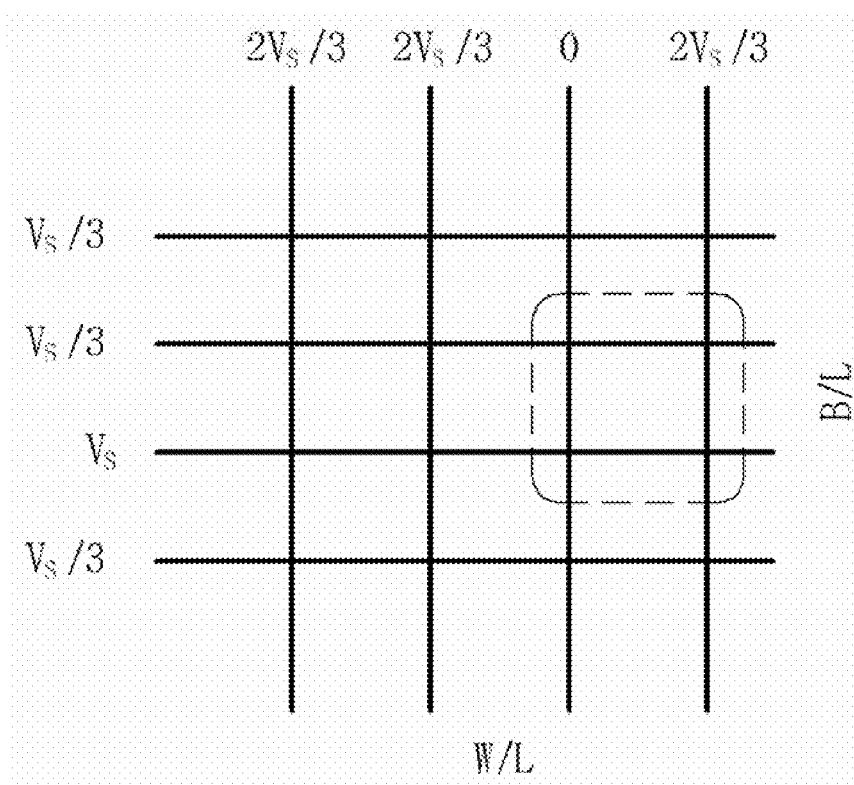
FIG. 4 is a view illustrating a voltage applying method selecting a specific memory cell in voltage rule of thirds.
Figure 5A:
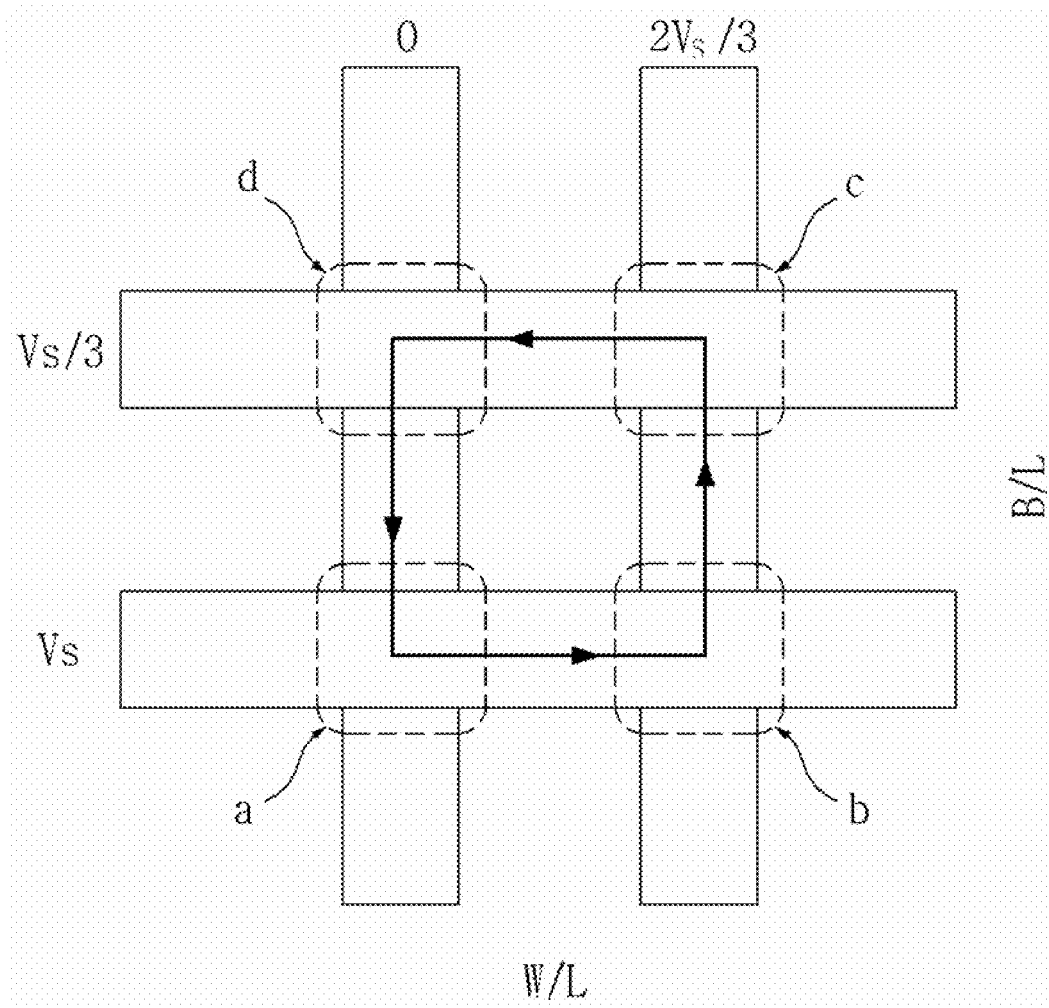
FIG. 5a is a view illustrating a dotted line part of FIG. 4 in detail.
Figure 5B:
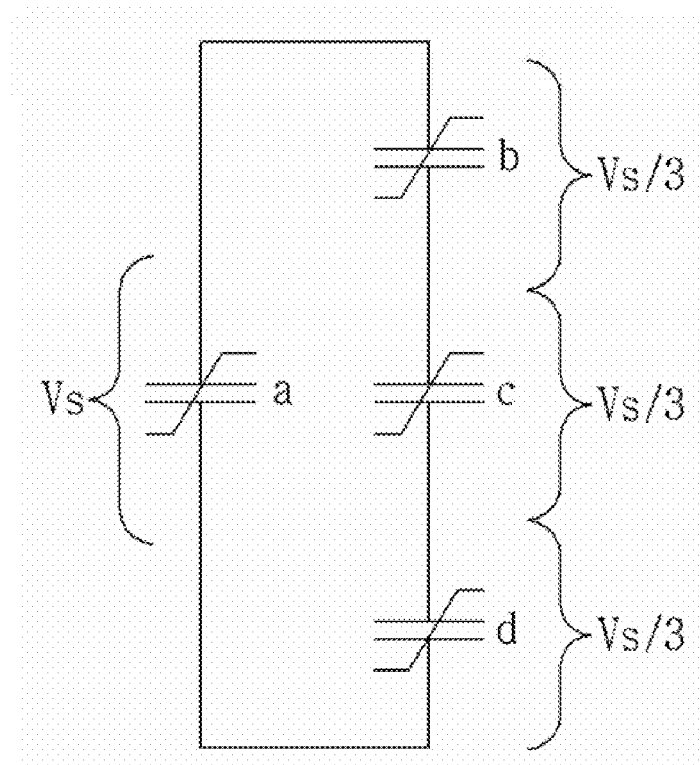

FIG. 5a is a view illustrating a dotted line part of FIG. 4 in detail. FIG. 5b is a view illustrating an equivalent circuit of a closed circuit including memory cells a, b, c, and d shown in FIG. 5a.

Figure 5C:
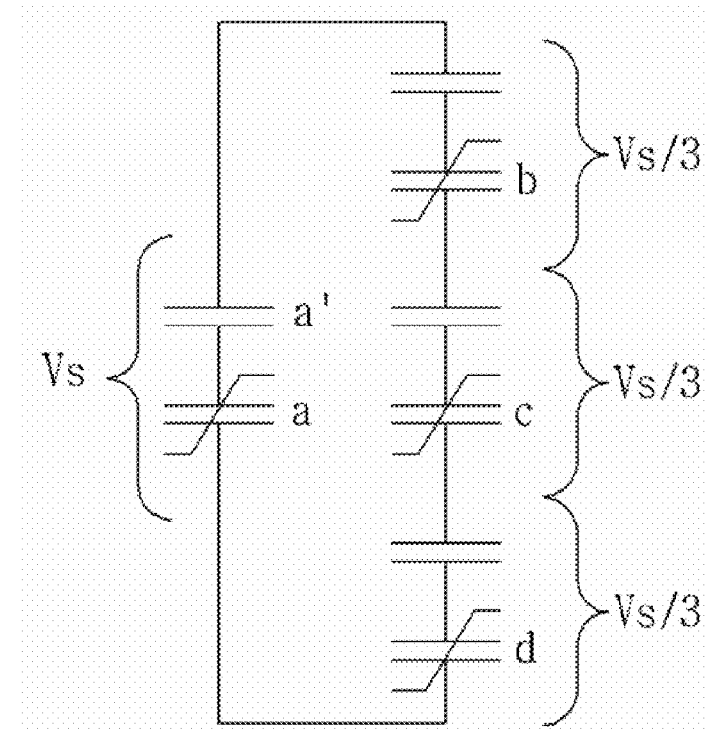
FIG. 5c is a view illustrating an equivalent circuit obtained by adding a capacitor to an equivalent circuit of FIG. 5b.

Referring to FIG. 5b, a driving voltage Vs necessary for data storage is applied to a selected memory cell a. However, an interference voltage Vs/3 obtained by dividing a driving voltage Vs by 3 is applied to non-selected memory cells b, c, and d. Because equivalent capacitance of a memory cell can be changed according to a location and the size of a memory cell storing data, different voltages can be applied to the memory cells b, c, and d. Accordingly, a voltage greater than the interference voltage Vs/3 may be applied to at least one of the memory cells b, c, and d to influence the memory cell storing data. Accordingly, in order to fundamentally reduce the influence due to the interference voltage Vs/3, as shown in FIG. 5c, an additional capacitor a' is connected between two capacitors composed of a ferroelectric or electret material in series. Accordingly, a voltage less than the interference voltage Vs/3 is applied to the non-selected memory cells. Further, the additional capacitor a' performs a switch function in order not to apply a voltage less than a driving voltage Vs to a selected memory cell storing data.

Hereinafter, a passive matrix-addressable memory apparatus in accordance with a first embodiment of the present invention will be described in detail with reference to the accompanying drawings.

Figure 6:
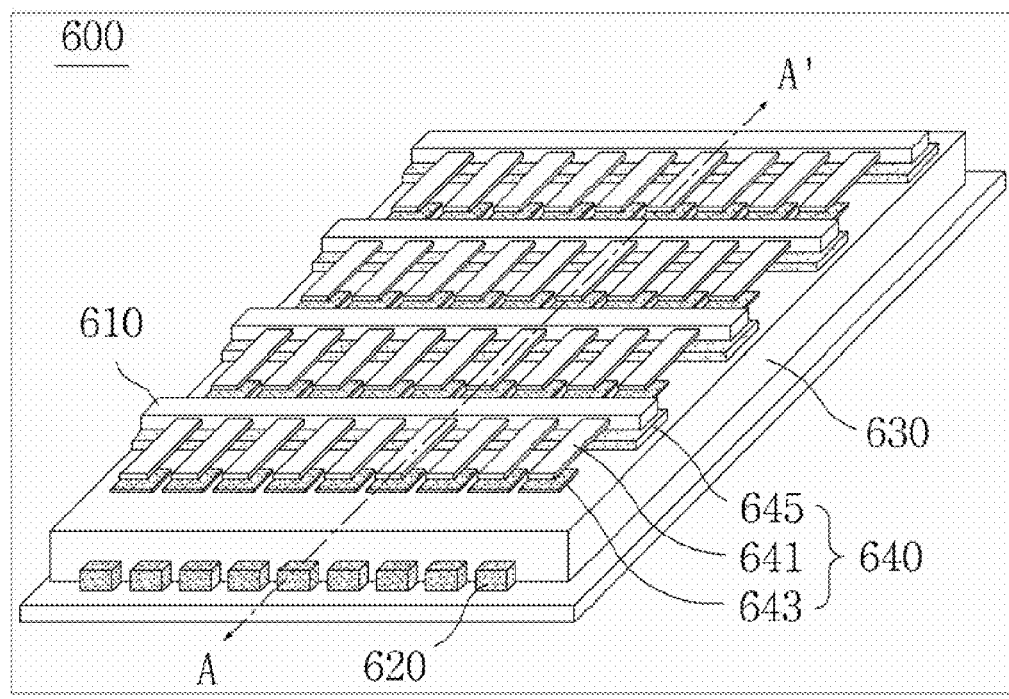
FIG. 6 is a view illustrating a memory apparatus in accordance with a first embodiment of the present invention.
Figure 7:
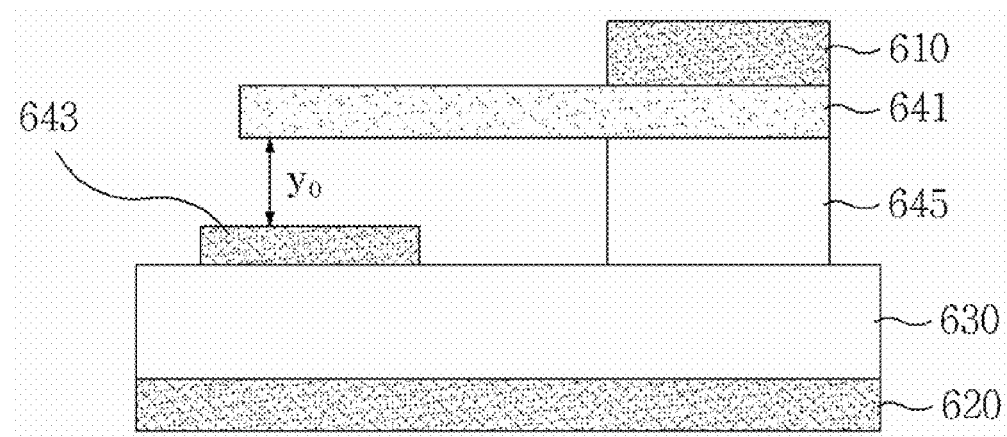
FIG. 7 is a cross-sectional view illustrating a memory cell in accordance with a first embodiment of the present invention.

FIG. 6 is a view illustrating a passive matrix-addressable memory apparatus 600 in accordance with a first embodiment of the present invention. FIG. 7 is a cross-sectional view of a memory cell taken along line A-A'.

Referring to FIGS. 6 and 7, the passive matrix-addressable memory apparatus 600 in accordance with a first embodiment of the present invention comprises a plurality of first electrode lines 610, a plurality of second electrode lines 620, a memory unit 630, and a switch unit 640.

The first electrode lines 610 are horizontally arranged with respect to each other.

The second electrode lines 620 are disposed orthogonal to the first electrode lines 610 to be horizontally arranged with respect to each other. In this case, the second electrode lines 620 may be arranged orthogonal to the first electrode lines 610 with the memory unit 630 between.

The first electrode lines 610 or the second electrode lines 620 shown in FIG. 6 may be defined as bit lines or word lines.

The memory unit 630 is provided between the plurality of first electrode lines 610 and the plurality of second electrode lines 620. The memory unit 630 includes electrically polarizable materials exhibiting hysteresis.

The memory unit 630 is a layer formed to contain electrically polarizable ferroelectric or electret materials exhibiting hysteresis in a characteristic curve indicating polarization-voltage, electric current-voltage, or capacitance-voltage relationship. Although an external voltage is applied to the ferroelectric or electret materials, they have polarization in which ions or molecules are arranged in a specific direction. There are two stable states according to polarization, and each thereof may be regarded as logic states '0' and '1'. Accordingly, the memory unit 630 may function to store data using the polarization properties.

The switch unit 640 includes first electrodes 641, second electrodes 643, and a support portion 645.

The first electrodes 641 are respectively formed between the memory unit 630 and the plurality of first electrode lines 610. The first electrodes 641 are electrically connected to the first electrode lines 610 of a cantilever structure, respectively. The first electrodes 641 are formed to contain metals, conductive polymers, carbon nano tubes, and fullerenes $C_{60}$.

The second electrodes 643 are electrically connected to the memory unit 630, which are spaced apart from the first electrode 641 to face each other.

The support portion 645 is provided between the first electrodes 641 and the memory unit 630, and the first electrodes 641 are supported on the memory unit 630 to be spaced apart from the second electrodes 643.

Referring to FIG. 7, when a voltage applied between the first electrodes 641 and the second electrodes 643 is less than or equal to a pull-in voltage $V_{PI}$, the first electrodes 641 maintain a distance spaced apart as much as $y_0$ from the second electrodes 643. That is, the switch unit 640 does not perform a switching operation. In this case, the first electrodes 641 and the second electrodes 643 may be modeled as a capacitor.

Further, if a voltage applied between the first electrodes 641 and the second electrodes 643 through the first electrode line 610 is equal to or greater than the pull-in voltage $V_{PI}$, the first electrodes 641 are moved to the second electrodes 643 to contact therewith due to electrostatic attraction. Here, the first electrodes 641 and the second electrodes 643 are electrically connected to each other, which may be modeled as a resistor. Moreover, when the voltage applied between the first electrodes 641 and the second electrodes 643 is less than a pull-out voltage $V_{Po}$, the first electrodes 641 moved to the second electrodes 643 return to an original state.

Figure 8:
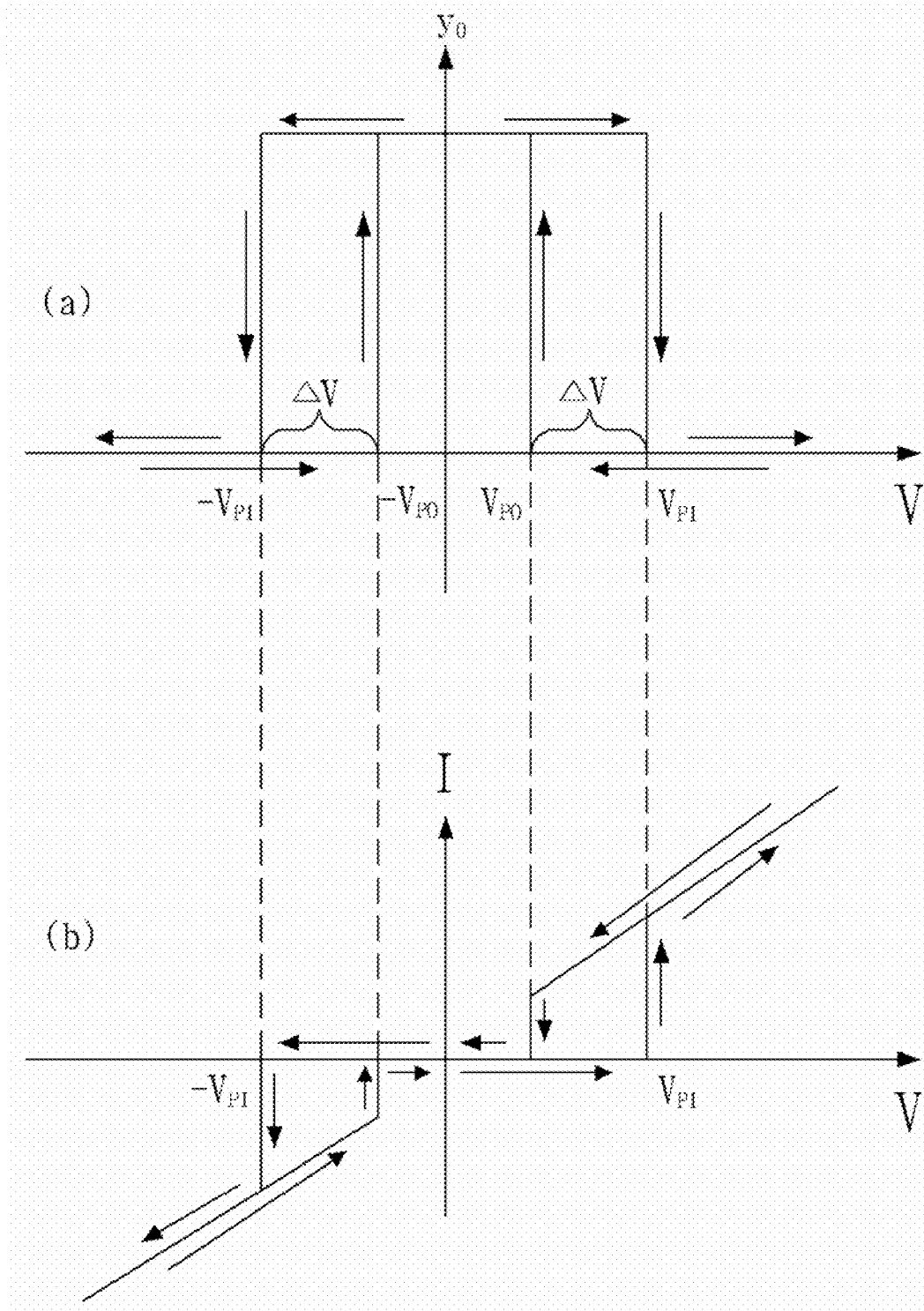
FIG. 8 is a graph illustrating a displacement and a current variation according to a voltage applied to a switch unit in accordance with a first embodiment of the present invention.

FIG. 8a is a graph illustrating a change in a spacing distance $y_0$ between the first electrodes 641 and the second electrodes 643 according to an amplitude of a voltage applied between the first electrodes 641 and the second electrodes 643.

FIG. 8b is a graph illustrating current variation flowing through the first electrodes 641 according to amplitude of a voltage applied between the first electrodes 641 and the second electrodes 643.

For mechanical switching operation of the first electrodes 641, a positive voltage or a negative voltage may be applied to the first electrodes 641 through the first electrode line 610. The reason is that electrostatic attraction occurs between the first electrodes 641 and the second electrodes 643 to achieve mechanical switching operation when the voltage applied to the first electrodes 641 and the second electrodes 643 is equal to or greater than the pull-in voltage $V_{PI}$. Consequently, mechanical switching operation of the first electrodes 641 is not related to polarity of a voltage applied to the first electrode 641 through the first electrode line 610.

FIGS. 9a to 9d are equivalent circuits illustrating a driving method of a memory cell in accordance with the present invention.

Reference numeral "$V_S$" shown in FIGS. 9a to 9d represents an operation voltage applied to a memory cell through the first electrode line 610 and the second electrode line 620 shown in FIG. 6 or FIG. 7.

Reference numeral "$V_R$" shown in FIGS. 9a to 9d represents a voltage applied between the first electrodes 641 and the second electrodes 643 shown in FIG. 6 or FIG. 7.

Reference numeral "$V_F$" shown in FIGS. 9a to 9d represents a voltage applied to the memory unit 630 shown in FIG. 6 or FIG. 7.

Reference numeral "$V_{PI}$" shown in FIGS. 9a to 9d represents a pull-in voltage of the switch unit 640 shown in FIG. 6 or FIG. 7.

Reference numeral "R" shown in FIGS. 9a to 9d represents the switch unit 640 shown in FIG. 6 or FIG. 7 acting as a resistor.

Reference numeral "$C_R$" shown in FIGS. 9a to 9d represents the switch unit 640 shown in FIG. 6 or FIG. 7 acting as a capacitor.

Reference numeral "$C_F$" shown in FIGS. 9a to 9d represents the memory unit 630 shown in FIG. 6 or FIG. 7 acting as a capacitor.

Figure 9A:
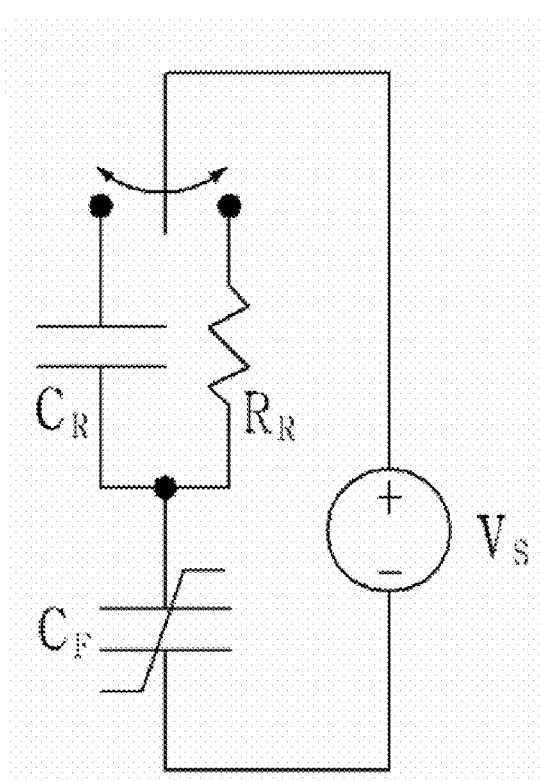
FIG. 9a through FIG. 9d are views illustrating a driving method of a memory cell in accordance with a first embodiment of the present invention.

First, referring to FIG. 9a, it will be appreciated that the switch unit 640 may be modeled as a capacitor $C_R$ or a resistor $R_R$ according to an amplitude of a voltage applied to the switch unit 640.

Figure 9B:
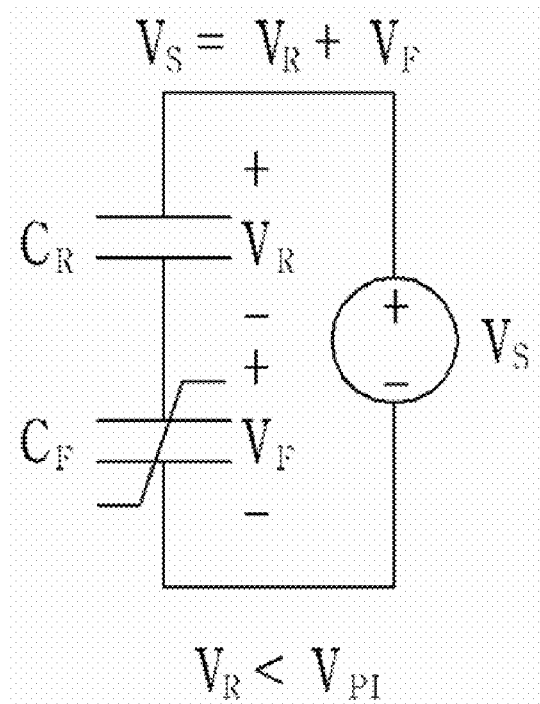

As shown in FIG. 9b, when the operation voltage $V_S$ is applied to a memory cell such that the voltage $V_R$ is less than the pull-in voltage $V_{PI}$, the operation voltage $V_S$ is divided into $V_R$ and $V_F$ to be applied thereto according to capacitances of serially connected $C_R$ and $C_F$.

Figure 9C:
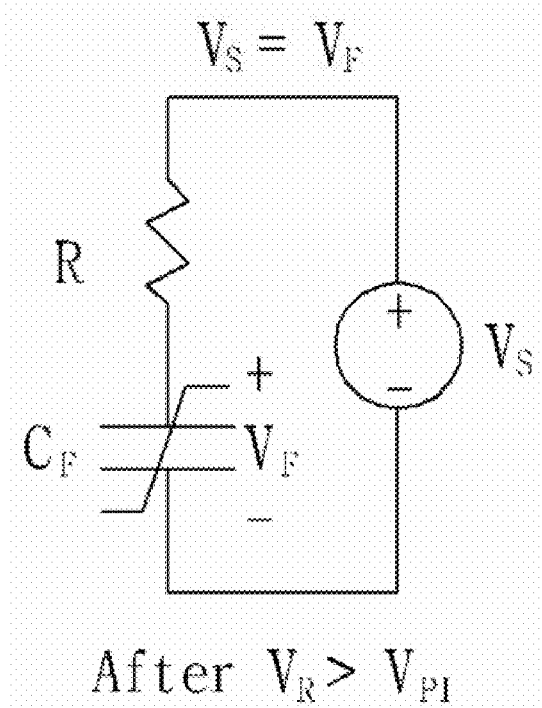

As shown in FIG. 9c, after $V_R$ is equal to or greater than $V_{PI}$, as described above, the first electrodes 641 are electrically connected to the second electrodes 643. This causes the $C_R$ to be operated as a resistor R.

When the operation voltage $V_S$ is an interference voltage $V_S/3$, the interference voltage $V_S/3$ is less than a pull-in voltage $V_{PI}$ of $C_R$. Accordingly, the operation voltage $V_S$ is divided into $V_R$ and $V_F$ to be applied thereto according to capacitances of serially connected $C_R$ and $C_F$. Accordingly, a voltage less than the interference voltage $V_S/3$ may be applied to the $C_F$. When the interference voltage $V_S/3$ is applied, a real voltage $V_F$ applied to the $C_F$ can be expressed by the following equation 1.

$$V_F = \frac{C_R}{C_F + C_R} V_S \qquad (1)$$

When an operation voltage Vs for writing data in a memory is applied to a switch unit 640 shown in FIG. 6 or FIG. 7, it acts as a resistor R like an equivalent circuit shown in FIG. 9c. A voltage $V_F$ except for a minimum voltage closing the switch unit R is applied to a memory unit $C_F$. Accordingly, the voltage $V_F$ applied to the memory unit is set to be sufficiently larger than a coercive voltage of the memory unit to enable polarization reversal.

Figure 9D:
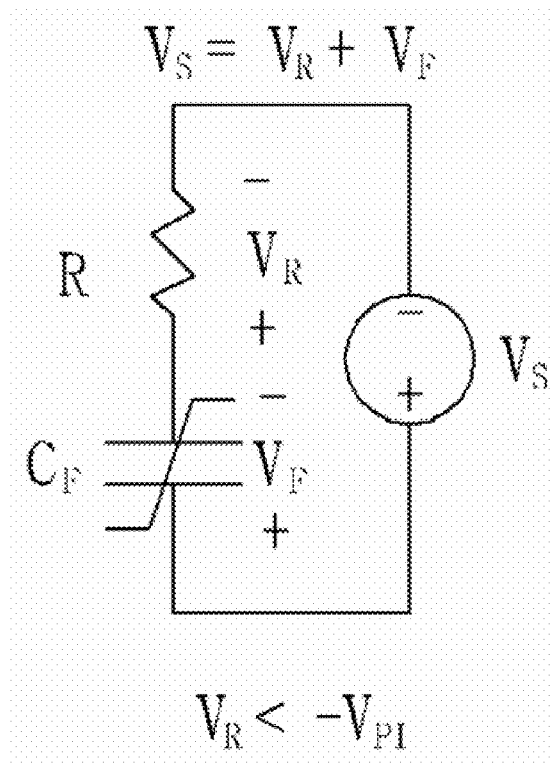

FIG. 9d shows an equivalent circuit illustrating an erase operation of a memory cell. The operation voltage $V_S$ shown in FIG. 9d has a polarity opposite to that of a voltage applied to a memory cell during a write operation, which may have a significantly large value.

FIG. 10 is a view illustrating another example of the switch unit.

Figure 10A:
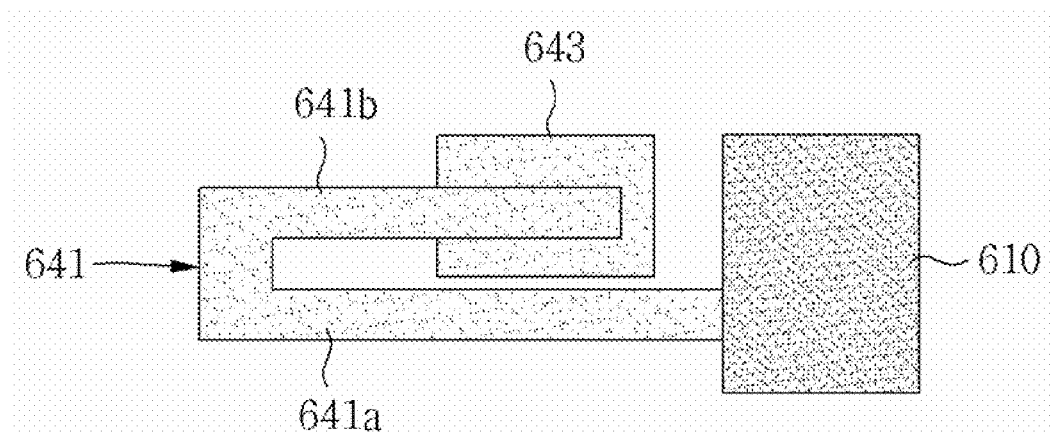
FIGS. 10a and 10b are views illustrating a switch unit in accordance with a first embodiment of the present invention.

The first electrodes 641 shown in FIG. 6 or FIG. 7 may be embodied in a straight cantilever form. However, upon embodying a high integration memory cell, because a space between cells is very narrow, a high voltage is required to drive the first electrodes 641. Accordingly, the first electrodes 641 may be formed by a structure as shown in FIG. 10a using a principle that the longer the lengths of the first electrodes are, the smaller a driving voltage is. That is, the first electrodes 641 of a cantilever form horizontally extend from the second electrodes 643 and are bent at least once.

Figure 10B:
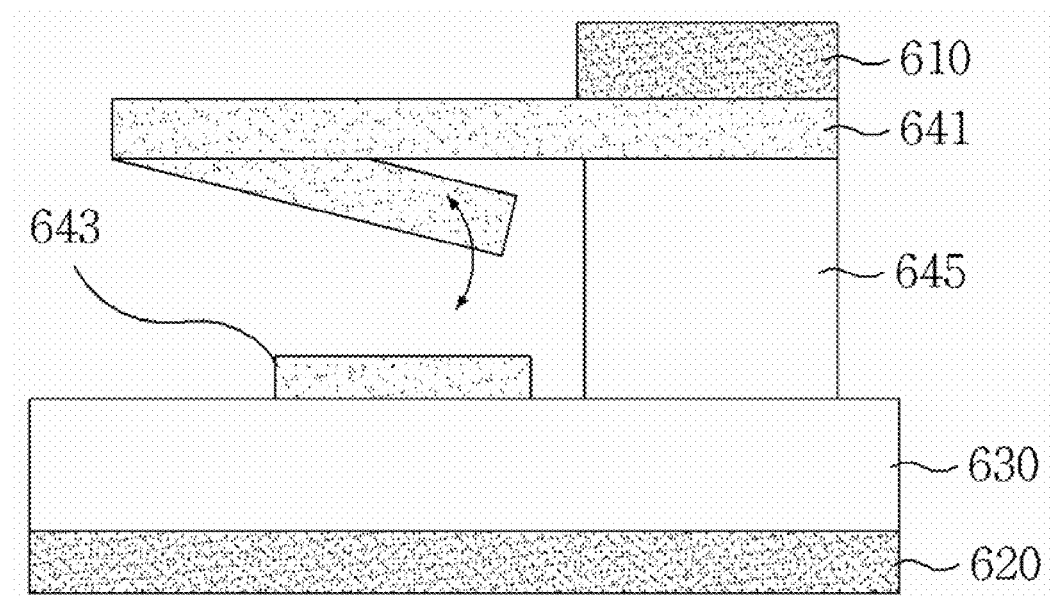

FIG. 10a is a view illustrating an upper portion of a switch unit having another shape. FIG. 10b is a side view illustrating the switch unit of FIG. 10a.

As shown in FIGS. 10a and 10b, the first electrode 641 is bent in a 'ㄷ' shape. One side 641a of the first electrode 641 is electrically connected to the first electrode line 610. Another side 641b of the first electrode 641 is formed to face the second electrode 643. Since the switch unit 640 having the above structure may enlarge the length of the first electrode 641 in a limited space, a driving voltage of the switch unit 640 can be further reduced.

In the passive matrix-addressable memory apparatus in accordance with an embodiment of the present invention, an inevitably generated interference voltage is applied to the switch unit and the memory unit to be divided. Accordingly, although the exposed number of the interference voltage is increased, a data state may be continuously maintained, thereby significantly reducing a data error rate. Further, the number of refresh operations may be reduced to minimize power consumption. In addition, although the memory apparatus is not divided into a plurality of segments, it can resist electric interference. Accordingly, the present invention may use a merit of high-density storage capacity of a passive matrix memory structure to the utmost.

Hereinafter, a passive matrix-addressable memory apparatus in accordance with a second embodiment of the present invention will be described in detail with reference to the accompanying drawings.

Figure 11A:
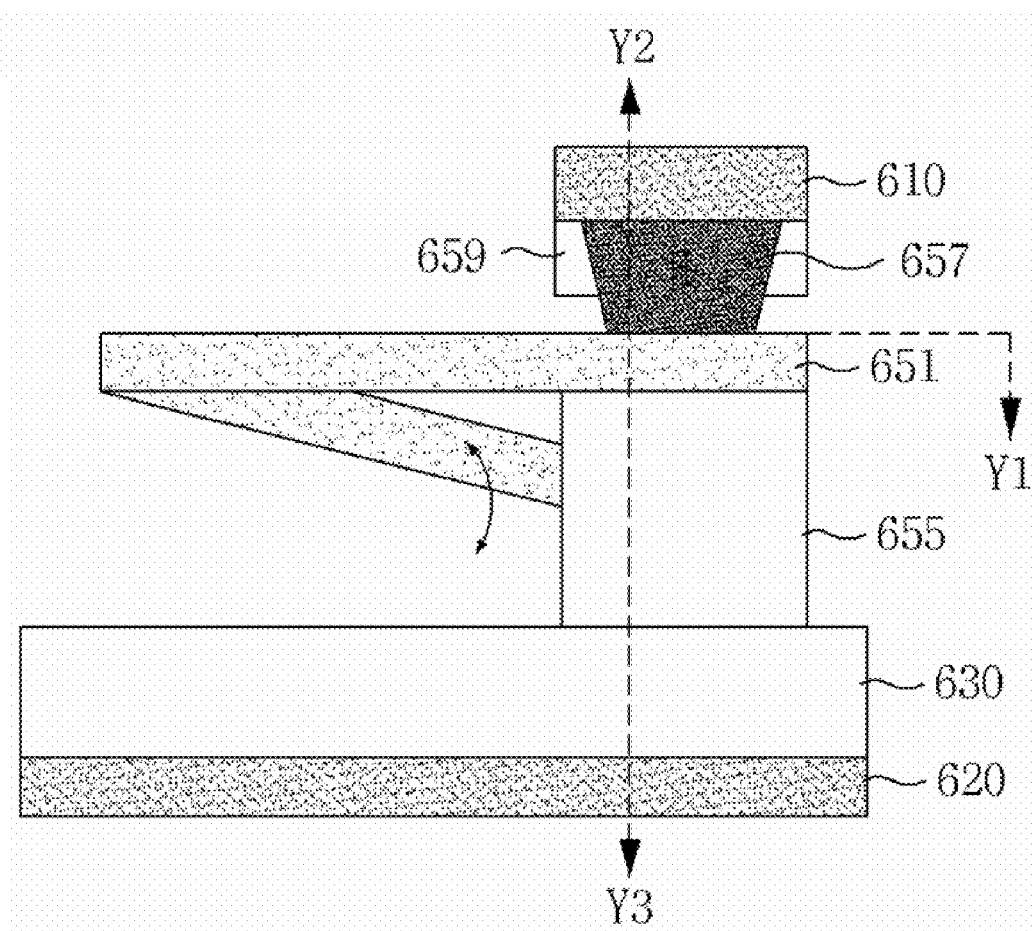
FIGS. 11a through 11c are views illustrating a switch unit in accordance with a second embodiment of the present invention.

FIG. 11a is a view illustrating a memory cell in accordance with a second embodiment of the present invention.

Figure 11B:
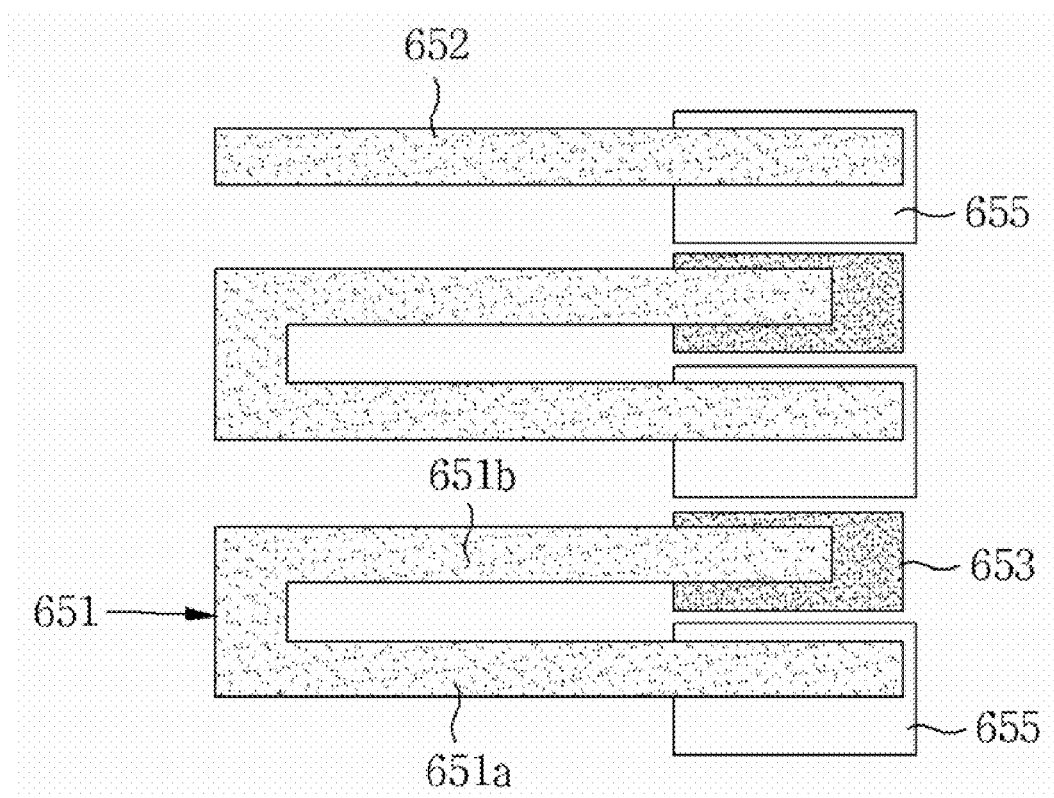

FIG. 11b is a view illustrating an upper portion of a memory cell of FIG. 11a taken in a Y1 direction.

Figure 11C:
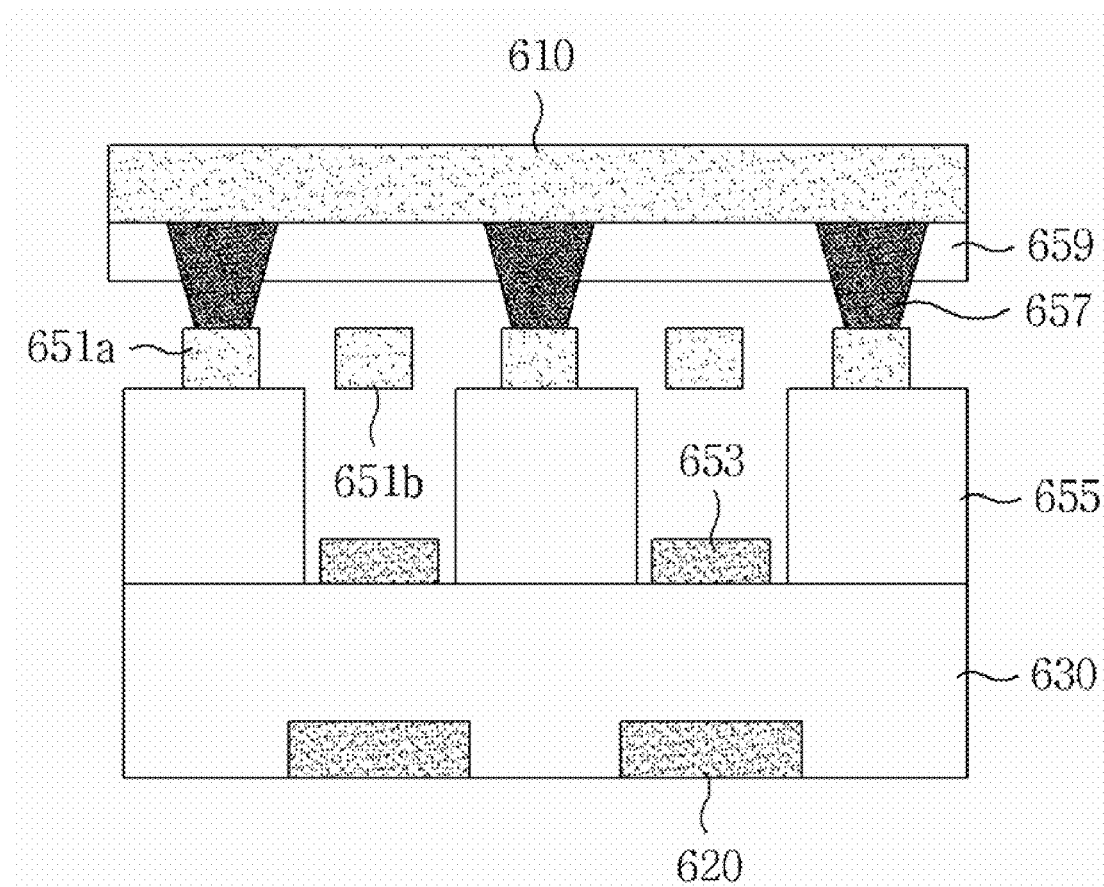

FIG. 11c is a side view illustrating a memory cell taken in a Y2-Y3 direction.

Referring to FIGS. 11a to 11c, the passive matrix-addressable memory apparatus in accordance with a second embodiment of the present invention comprises a plurality of first electrode line 610, a plurality of second electrode line 620, switch units 651, 653, 655, 657, and 659, and a memory unit 630.

Referring to FIGS. 11a to 11c, upon comparing the passive matrix-addressable memory apparatus in accordance with the first embodiment of the present invention with the passive matrix-addressable memory apparatus in accordance with a second embodiment of the present invention, there is a difference in constructions of switch units 651, 653, 655, 657, and 659. Accordingly, the constructions of a plurality of first electrode line 610, a plurality of second electrode lines 620, and a memory unit 630 of passive matrix-addressable memory apparatus in accordance with the second embodiment of the present invention are identical with those of a plurality of first electrode lines 610, a plurality of second electrode lines 620, and a memory unit 630 of passive matrix-addressable memory apparatus in accordance with the first embodiment of the present invention.

Referring to FIGS. 11a to 11c, switch units 651, 653, 655, 657, and 659 of the second embodiment of the present invention comprise a first electrode 651, a second electrode 653, a support portion 655, a via hole 657, and an insulation layer 659.

As shown in FIGS. 11a and 11b, one side 651a of the first electrode 651 is electrically connected to the first electrode line 610. Another side 651b of the first electrode 651 is disposed between the first electrode line 610 and the second electrode 653 to be spaced apart from the first electrode line 610 and the second electrode 653.

An insulation layer 659 is formed between the one side 651a of the first electrode 651 and the first electrode line 610.

A via hole 657 is formed of a metal material, which is formed to penetrate the insulation layer 659 so that the first electrode line 610 and the one side 651a of the first electrode 651 are electrically connected to each other.

Since one side 651a of the first electrode 651 is electrically connected to the first electrode line 610, a voltage polarity of the first electrode 651 is identical with that applied to the first electrode line 610. As shown in FIG. 11c another side 651b of the first electrode 651 is disposed between the first electrode line 610 and the second electrode 653 to be spaced apart from the first electrode line 610 and the second electrode 653. Further, another side 651b is disposed at the first electrode line 610 and the second electrode 653 in a straight line. Accordingly, when a driving voltage is applied through the first electrode line 610, an electrostatic repulsion occurs between the first electrode line 610 and another side 651b of the first electrode 651. An electrostatic attraction occurs between the second electrode 653 and another side 651b of the first electrode 651. If a voltage applied through the first electrode line 610 is equal to or greater than a predetermined voltage level, the first electrode 651 is moved to the second electrode 653 by electrostatic repulsive force and electrostatic attraction. Accordingly, the first electrode 651 contacts to be electrically connected to the second electrode 653. In this case, the first electrode 615 and the second electrode 653 are modeled as a resistor.

Further, when a voltage applied to the first electrode 651 is less than or equal to a predetermined voltage, the first electrode 651 and the second electrode 652 are spaced apart from each other by a predetermined distance, which thus act as a capacitor.

As described above, since the first electrode 651 driven by electrostatic repulsion and attraction may be driven at a driving voltage less than that in the switch unit 640 according to the first embodiment of the present invention driven by only electrostatic attraction, a driving voltage of the memory apparatus may be reduced.

In addition, as illustrated in the first embodiment, the first electrode 651 in a cantilever shape is configured in a "⊏"shape to enlarge the length of the first electrode 651, thereby further reducing driving voltages of the switch units 651, 653, 655, 657, and 659. An increased region due to the enlargement of the length in the first electrode 651 may be compensated by area reduction of the support portion 645. Namely, unlike the first embodiment of the present invention, the support portion 655 is divided in units of memory cells, and another side 651b of the first electrode 651 having the enlarged length is located in a divided region, with the result that an increased region due to the length enlargement of the first electrode 651 can be compensated to some degree.

Although embodiments in accordance with the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

What is claimed is:

1. A passive matrix-addressable memory apparatus comprising:
    a plurality of first electrode lines horizontally arranged with respect to each other;
    a plurality of second electrode lines disposed crossing the plurality of first electrode lines to be horizontally arranged with respect to each other;
    a memory unit formed between the plurality of first electrode lines and the plurality of second electrode lines, and containing an electrically polarizable material exhibiting hysteresis; and
    a switch unit,
    wherein the switch unit comprises:
    first electrodes of a cantilever structure respectively formed between the memory unit and the plurality of first electrode lines to be electrically connected to the plurality of first electrode lines; and
    second electrodes electrically connected to the memory unit to be spaced apart from the first electrodes to face the first electrodes,
    the first electrodes and the second electrodes are electrically connected to each other when a voltage applied between the first electrodes and the second electrodes is equal to or greater than a predetermined voltage.

2. The passive matrix-addressable memory apparatus according to claim 1, wherein the switch unit further comprises a support portion formed between the first electrodes and the memory unit for supporting the first electrodes on the memory unit so that the first electrodes are spaced apart from the memory unit.

3. The passive matrix-addressable memory apparatus according to claim 1, wherein the memory unit contains one of a ferroelectric material and an electret material.

4. The passive matrix-addressable memory apparatus according to claim 1, wherein the first electrodes are formed to contain at least one of metals, conductive polymers, carbon nano tubes, and fullerenes.

5. The passive matrix-addressable memory apparatus according to claim 1, wherein the first electrodes are linearly formed or bent at least once in a horizontal direction of the second electrodes.

6. The passive matrix-addressable memory apparatus according to claim 1, wherein the first electrodes are moved to the second electrodes to be electrically connected to the second electrodes by electrostatic attraction when a voltage applied between the first electrodes and the second electrodes is equal to or greater than a predetermined voltage.

7. A passive matrix-addressable memory apparatus comprising:

a plurality of first electrode lines horizontally arranged with respect to each other;

a plurality of second electrode lines disposed crossing the plurality of first electrode lines to be horizontally arranged with respect to each other;

a memory unit formed between the plurality of first electrode lines and the plurality of second electrode lines, and containing an electrically polarizable material exhibiting hysteresis; and a switch unit, wherein the switch unit comprises:

first electrodes of a cantilever structure respectively formed between the memory unit and the plurality of first electrode lines, one sides of the first electrodes being electrically connected to the first lines, another sides of the first electrodes being spaced apart from the plurality of first electrode lines to face the first electrode lines; and second electrodes electrically connected to the memory unit to be spaced apart from the another sides of the first electrodes to face the first electrodes, wherein the first electrodes and the second electrodes are electrically connected to each other when a voltage applied between the first electrodes and the second electrodes is equal to or greater than a predetermined voltage.

8. The passive matrix-addressable memory apparatus according to claim 7, wherein the switch unit further comprises a support portion formed between the first electrodes and the memory unit for supporting the first electrodes on the memory unit so that the first electrodes are spaced apart from the memory unit.

9. The passive matrix-addressable memory apparatus according to claim 7, wherein the memory unit contains one of a ferroelectric material and an electret material.

10. The passive matrix-addressable memory apparatus according to claim 7, wherein the first electrodes are formed to contain at least one of metals, conductive polymers, carbon nano tubes, and fullerenes.

11. The passive matrix-addressable memory apparatus according to claim 7, wherein the first electrodes are linearly formed or bent at least once in a horizontal direction of the second electrodes.

12. The passive matrix-addressable memory apparatus according to claim 7, wherein the first electrodes are moved to the second electrodes to be electrically connected to the second electrodes by electrostatic repulsion between the first electrodes and the first electrode line and electrostatic attraction between the first electrodes and the second electrodes when a voltage applied between the first electrodes and the second electrodes is equal to or greater than a predetermined voltage.

* * * * *